United States Patent [19]
Senn et al.

[11] Patent Number: 5,093,664
[45] Date of Patent: Mar. 3, 1992

[54] HIGH-SPEED HALF-FLASH TYPE ANALOG/DIGITAL CONVERTER

[75] Inventors: Patrice Senn, Grenoble; André Abrial, Le Versoud, both of, France

[73] Assignee: Minister of Post, Telecommunications and Space French State, Center National d'Etudes des Communication, Les Moulineaux, France

[21] Appl. No.: 590,823

[22] Filed: Oct. 1, 1990

[30] Foreign Application Priority Data

Oct. 2, 1989 [FR] France ............... 89 13048

[51] Int. Cl.$^5$ .......................................... H03M 1/14
[52] U.S. Cl. ................................ 341/156; 341/159
[58] Field of Search ............................. 341/156, 159

[56] References Cited

U.S. PATENT DOCUMENTS

| | | | |
|---|---|---|---|
| 4,533,903 | 8/1985 | Yamada et al. | 341/156 |
| 4,745,393 | 5/1988 | Tsukada et al. | 341/156 |
| 4,912,470 | 3/1990 | Hosotani et al. | 341/159 |
| 4,999,630 | 3/1991 | Masson | 341/120 |

OTHER PUBLICATIONS

Matsuura et al., "An 8b 20MHz CMOS Half-Flash A/D Converter", 1988 IEEE Solid-State Circuits Conference, Feb. 17-19, New York, N.Y., pp. 220, 221, 376.

*Primary Examiner*—A. D. Pellinen
*Assistant Examiner*—Marc S. Hoff
*Attorney, Agent, or Firm*—Lowe, Price, LeBlanc & Becker

[57] ABSTRACT

An analog/digital converter supplying logic words constituted by P high order bits and Q low order bits, comprises: a divider (2), $2^P$ high weight comparators (5), $2^Q$ low weight comparators (11), and a selector (14). The high weight comparators have their second inputs (E21) enabled by the clock signal (H) and their first inputs (E11) enabled by the reverse clock signal (H*). The low weight comparators have their first inputs (E12) enabled by the reverse clock signal (H*) and their second inputs (E22) enabled by the clock signal (H).

8 Claims, 2 Drawing Sheets

HIGH-SPEED HALF-FLASH TYPE ANALOG/DIGITAL CONVERTER

BACKGROUND OF THE INVENTION

The invention relates to analog/digital converters (ADC) with a high conversion frequency and more particularly to ADC usable in the video field.

One already knows so-called "flash" ADC which comprise a voltage divider constituted for example by a resistive array supplying $2^N$ stepped reference voltages. In order to convert an analog signal into an N-bits word, they include $2^N$ comparators, each of which compares the analog signal with one of the reference voltages. The comparator outputs are connected to a coding device designed to supply the N bits of the logic word. All comparators are controlled in parallel at each clock cycle and the conversion frequency is equal to the clock frequency. However, such a number of comparators occupies a substantial circuit surface and is power consuming.

In order to reduce the number of comparators, so-called "half-flash" comparators have been provided. Analog signals are converted into logic words constituted by P high order bits and Q low order bits (P+Q=N). "Half-flash" converters comprise $2^P$ comparators called high weight comparators for supplying after coding, during a first clock period, high order bits, and $2^Q$ comparators called low weight comparators for supplying after coding, during the next clock period, low order bits.

But such "half-flash" comparators have a conversion frequency half that of "flash" converters. Moreover, they must include means for maintaining the analog input voltage during two clock periods as for example sample and hold circuits.

SUMMARY OF THE INVENTION

Thus, an object of the invention is to provide an ADC of the "half-flash"-type operating at a high conversion frequency.

Another object of the invention is to provide such a simplified ADC wherein no means is used for storing the analog input signal.

To achieve those objects, the invention provides an ADC receiving analog signals on an input terminal and supplying logic words made of P high order bits and Q low order bits. This ADC comprises:

a divider supplying on first outputs $2^P$ main voltages separated by regular steps, each step being partitioned into $2^Q+1$ equal sub-steps, and supplying on second outputs, for each step, $2^Q$ secondary voltages between each sub-step pair, $2^P$ high weight comparators, each of which has a first input connected to the input terminal, a second input connected to a first distinct output and an output connected to a first coding device which is connected to P high order bit output terminals, $2^Q$ low weight comparators, each of which has a first input connected to the input terminal and an output connected to a second coding device which is coupled at the output to Q low order bit output terminals, a selector connected, on the one hand, to a second input of each low weight comparator and, on the other hand, to the second outputs of said divider associated with each step, and, a clock.

According to an embodiment of the invention, the high weight comparators have their second inputs enabled by the clock signal for an initialization on the main voltages and their first inputs enabled by the reverse clock signal for comparison with the analog input voltage and for determining a step.

According to another embodiment of the invention, the first coding device comprises means for controlling the selector in order to establish, at the end of each comparison of the high weight comparators, a connection between the $2^Q$ second inputs of the low weight comparators and the $2^Q$ second outputs associated with the determined step.

According to a further embodiment of the invention, the low weight comparators have their first inputs enabled by the reverse clock signal for an initialization on the analog input voltage and their second inputs enabled by the clock signal for comparison with the secondary voltages.

BRIEF DESCRIPTION OF THE DRAWINGS

The foregoing and other objects, features and advantages of the invention will be apparent from the following detailed description of a preferred embodiment as illustrated in the accompanying drawings wherein.

For the sake of clarity, an embodiment of an ADC converting analog signals into 4 bit words constituted by P=2 high order bits and Q=2 low order bits is described. However, the invention applies to ADC of the same type supplying for example 8, 16 or 32-bits logic words.

DETAILED DESCRIPTION OF THE INVENTION

Figure 1:
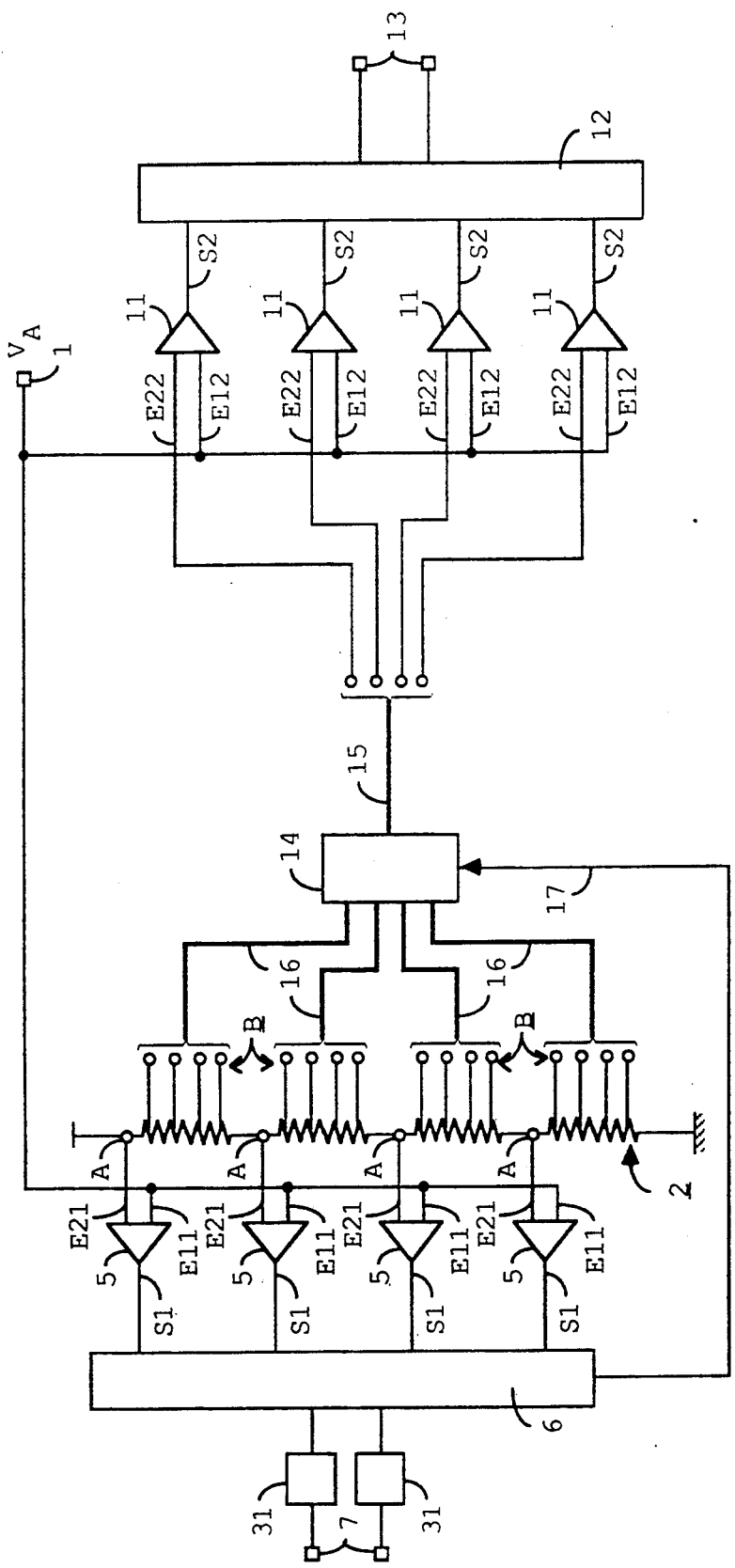
FIG. 1 schematically shows an ADC.

In FIG. 1 is shown an ADC which receives analog signals ($V_A$) on an input terminal 1. A voltage divider 2 supplies at outputs A, four main reference voltages $V_P$ separated by regular steps. Each step is divided into five equal sub-steps. Thus, the divider also supplies, for each main voltage, four secondary reference voltages $V_S$, each of which corresponds to a voltage value between a pair of sub-steps. As a whole, sixteen secondary reference voltages are available on outputs B of the divider.

Each of four high weight comparators 5 has a first input E11 connected to the input terminal 1 and a second input E21 connected to a distinct output A. The comparators also have an output S1 connected to a first coding device 6 which is connected at the output to two high order bit output terminals 7.

Each of four low weight comparators 11 has a first input E12 connected to the input terminal 1 and an output S2 connected to a second coding device 12 which is coupled to two low order bit output terminals 13. The second input E22 of each comparator is connected to a selector 14 through a 4-connection bus 15. The selector is also connected to each set of secondary outputs B associated with a step by means of a 4-connection bus 16.

The coding device 6 comprises control means connected to a control input 17 of the selector. The control of the selector will be explained in detail later on.

In addition, the converter comprises a clock H (not shown) whose signal includes during each period a high level and a low level.

Figure 2:
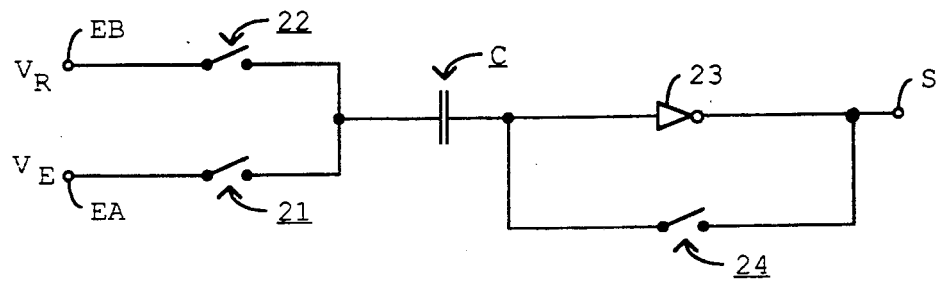
FIG. 2 schematically shows an exemplary auto-zero comparator usable in an ADC.

In FIG. 2 is schematically shown a conventional auto-zero comparator. This type of comparator can be used both for high weight comparators and low weight comparators.

It comprises a capacitor C, a first terminal of which is connected to the first input, generally referenced EA, through a switch 21 and to the second input EB of the comparator, through a switch 22. The second capacitor terminal is connected to the input of an inverter 23 whose output constitutes the comparator output S. An additional switch 24 is connected in parallel across the inverter terminals.

In order to compare a voltage $V_E$ applied at input EA with a reference voltage $V_R$ applied at input EB, the auto-zero comparators operate as follows. During a first phase, called initialization phase, the switch 21 is switched off and switches 22 and 24 are switched on. The inverter is self-looped and its input voltage is equal to its switching threshold voltage $V_O$. The charge Q of the capacitor is given by $Q = C(V_O - V_R)$.

During a second phase, called comparison phase, the switch 21 is switched on and switches 22 and 24 are switched off. The inverter has a very high input impedance, and the charge of the capacitor is maintained. Thus, the new input voltage $V_O^1$ of the inverter is associated with voltage $V_O$ through the relation $$V_O^1 - V_E = V_O - V_R$$

or $$V_O^1 = V_O - (V_R - V_E).$$

Thus, in the auto-zero comparators constant parasitic voltages are avoided.

Figure 3:
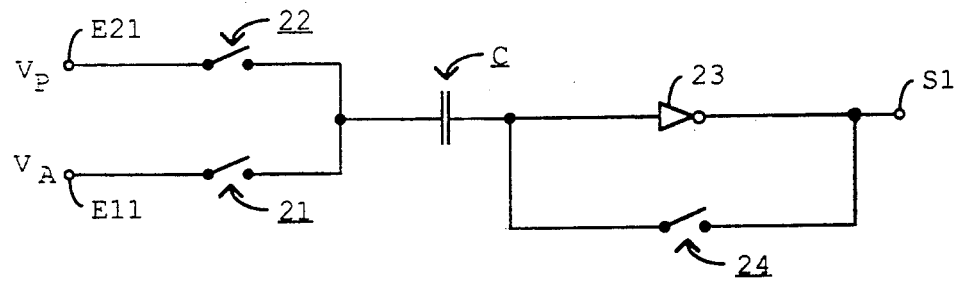
FIG. 3 schematically shows an auto-zero comparator used as a high weight comparator.

In FIG. 3 is shown such an auto-zero comparator used as a high weight comparator. The inputs, referenced E11 and E21 as in FIG. 1, receive the analog input voltage $V_A$ and one of the main reference voltages $V_P$, respectively.

The switches 22 and 24 are controlled by the clock signal H. They are on when signal H is at its high level and off when signal H is at low level. But, the switch 21 is controlled by the reverse clock signal H*, that is, it is on when the reverse signal is high and off when signal H* is low.

Thus, the high weight comparators are in an initialization state with respect to the main reference voltages $V_P$ when the clock signal is high, and in a comparison state when reading the analog input voltage $V_A$ when the reverse clock signal is high.

Preferably, transitions from high level to low level of the clock signals H and from low level to high level of the reverse clock signals H* are not overlapping and are separated by a small period of time.

At the end of each comparison phase of the high weight comparators, one of the main voltages VP corresponding to a specific step is determined. The coding device supplies high order bits at the output terminals 7.

Figure 4:
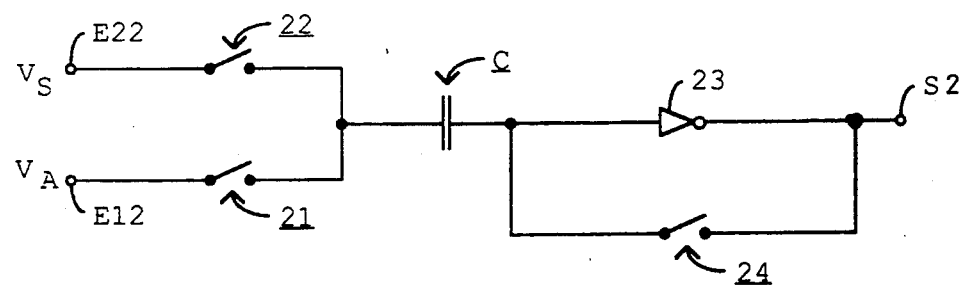
FIG. 4 shows an auto-zero comparator used as a low weight comparator.

In FIG. 4 is shown an auto-zero comparator used as a low weight comparator. The inputs E12 and E22 receive the analog input voltage $V_A$ and one of the secondary reference voltages $V_s$, respectively.

The switch 22 is synchronized on the clock signal H and switches 21 and 24 are synchronized on the reverse clock signal H*. When the signal H* is high, switches 21 and 24 are switched on and switch 22 is switched off. Thus, while the high weight comparators are in comparison mode and are reading the analog input voltage $V_A$, the low weight comparators are in initialization mode for the same input voltage $V_A$.

When comparisons have been completed by the high weight comparators and a specific step has been determined, the coding device 6 controls the selector 14 for establishing a connection between inputs E22 of the low weight comparators and the set of outputs B associated with the determined step.

When signal H is high, switch 22 is on and switches 21 and 24 are off. The low weight comparators are in comparison mode with respect to the secondary reference voltages $V_s$. Signals resulting from comparisons are sent to the coding device 12 which supplies low order bits at the output terminals 13.

Thus, high order bits are supplied at the clock frequency when signal H* is high, and low order bits are also supplied at the clock frequency when signal H is high. The converter conversion frequency is equal to the clock frequency.

Moreover, for each conversion into a logic word, the high weight comparators and low weight comparators simultaneously read the analog input voltage. It is no longer necessary to provide for means for storing the analog input voltage such as sample and hold circuits.

According to a variant of the invention, between each high order bit output terminal 7 and coding device 6, a flip-flop 31 is used for delaying by substantially half a period the output of the high order bits in order to simultaneously supply high order bits and low order bits.

We claim:

1. An analog/digital converter receiving analog signals at an input terminal and supplying logic words constituted by P high order bits and Q low order bits, where P and Q are positive integers, comprising:
    a divider supplying on first outputs $2^P$ main voltages separated by regular steps, each step being divided into $2^Q + 1$ equal sub-steps, and supplying on second outputs, for each step, $2^Q$ secondary voltages between each sub-step pair,
    $2^P$ high weight comparators, each of which has:
        (a) a first input connected to said input terminal,
        (b) a second input connected to a respective one of said first outputs of said divider, and
        (c) an output connected to a first coding device which is coupled to P high order bit output terminals,
    $2^Q$ low weight comparators, each of which has a first input connected to said input terminal and an output connected to a second coding device which is coupled to Q low order bit output terminals,
    a selector connected, on the one hand, to a second input of each of the low weight comparators and, on the other hand, to the second outputs associated with each step,
    a clock,
    said high weight comparators having their second inputs enabled by the clock signal for initialization with respect to the main voltages and their first inputs enabled by the reverse clock signal for comparison with the analog input voltage and for determining a step,
    said first coding device comprising means for controlling said selector in order to establish, at the end of each comparison of high weight comparators, a connection between the $2^Q$ second inputs of said low weight comparators and the $2^Q$ second outputs associated with the determined step, wherein said low weight comparators have their first inputs enabled by the reverse clock signal for initialization with respect to the analog input voltage and their second inputs enabled by the clock signal for comparison with the secondary voltages.

2. An analog/digital converter according to claim 1, wherein said high weight comparators and low weight comparators are auto-zero comparators.

3. An analog/digital converter according to claim 1, further comprising a flip-flop between each high order bit output terminal and said first coding device.

4. An analog/digital converter according to claim 1, wherein a frequency of said clock is equal to a frequency for converting said analog signals to said P high order bits and Q low order bits.

5. An analog/digital converter according to claim 1, wherein P and Q equal 4.

6. An analog/digital converter according to claim 1, wherein P and Q equal 8.

7. An analog/digital converter according to claim 1, wherein P and Q equal 16.

8. An analog/digital converter according to claim 1, wherein P and Q equal 32.

* * * * *